US011953168B2

(12) United States Patent
Lee et al.

(10) Patent No.: US 11,953,168 B2
(45) Date of Patent: Apr. 9, 2024

(54) LAMP EMPLOYING SEMICONDUCTOR LIGHT-EMITTING ELEMENT

(71) Applicant: LG ELECTRONICS INC., Seoul (KR)

(72) Inventors: Kyungho Lee, Seoul (KR); Hooyoung Song, Seoul (KR); Jinhyoun Joe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 639 days.

(21) Appl. No.: 17/257,771

(22) PCT Filed: Sep. 27, 2018

(86) PCT No.: PCT/KR2018/011357
§ 371 (c)(1),
(2) Date: Jan. 4, 2021

(87) PCT Pub. No.: WO2020/009276
PCT Pub. Date: Jan. 9, 2020

(65) Prior Publication Data
US 2022/0026036 A1    Jan. 27, 2022

(30) Foreign Application Priority Data
Jul. 5, 2018    (KR) .......................... 10-2018-0078341

(51) Int. Cl.
*H01L 25/075*    (2006.01)
*F21S 41/143*    (2018.01)
*H01L 33/62*    (2010.01)

(52) U.S. Cl.
CPC ........ *F21S 41/143* (2018.01); *H01L 25/0753* (2013.01); *H01L 33/62* (2013.01)

(58) Field of Classification Search
CPC ... F21S 41/143; F21S 41/141; H01L 25/0753; H01L 33/62; H01L 33/38; H01L 25/075;
(Continued)

(56) References Cited

U.S. PATENT DOCUMENTS

| 6,180,960 B1* | 1/2001 | Kusuda | ............... | H01L 33/0016 |
| | | | | 257/745 |
| 11,631,786 B2* | 4/2023 | Armitage | ............ | H01L 33/0025 |
| | | | | 257/13 |

(Continued)

FOREIGN PATENT DOCUMENTS

| CN | 102169933 A | 8/2011 |
| CN | 102956785 A | 3/2013 |

(Continued)

*Primary Examiner* — Kyoung Lee
*Assistant Examiner* — Christina A Sylvia
(74) *Attorney, Agent, or Firm* — Birch, Stewart, Kolasch & Birch, LLP (57) ABSTRACT

Discussed are a lamp or a lamp device employing a semiconductor light-emitting element to have a high degree of luminance uniformity. A lamp includes a circuit board; a bus electrode formed along one direction on the circuit board; electrode lines on the circuit board to extend from the bus electrode; semiconductor light-emitting elements arranged in the direction in which the electrode lines are formed, and spaced a predetermined distance apart from a nearby electrode line; transparent electrodes for electrically connecting the semiconductor light-emitting elements to the electrode lines; a current input unit formed along the one direction in parallel to the bus electrode; and connecting electrodes arranged between the bus electrode and the current input unit along the one direction, to electrically connect the bus electrode to the current input unit, wherein a resistance value of certain of the connecting electrodes is different from a resistance value of the rest.

20 Claims, 10 Drawing Sheets

(58) Field of Classification Search
CPC ............ H01L 33/48; G09G 2300/0426; G09G 2320/0223; F21K 9/20; F21Y 2115/10
See application file for complete search history.

(56) References Cited

U.S. PATENT DOCUMENTS

| | | |
|---|---|---|
| 2008/0018567 A1 | 1/2008 | Minami |
| 2008/0244944 A1* | 10/2008 | Nall ..................... F21V 23/005 40/544 |
| 2011/0204387 A1 | 8/2011 | Kim et al. |
| 2013/0050653 A1 | 2/2013 | Miyachi et al. |
| 2013/0057460 A1 | 3/2013 | Guo |
| 2015/0364443 A1* | 12/2015 | Bilenko ............ H01L 23/49575 257/773 |
| 2016/0126293 A1* | 5/2016 | Li .......................... H01L 33/32 257/29 |
| 2018/0138157 A1 | 5/2018 | Im et al. |
| 2018/0363864 A1 | 12/2018 | Kim et al. |

FOREIGN PATENT DOCUMENTS

| | | |
|---|---|---|
| CN | 103337233 B | 3/2016 |
| JP | 2011-243614 A | 12/2011 |
| JP | 2012-209475 A | 10/2012 |
| JP | 2013-55186 A | 3/2013 |
| KR | 10-2005-0032850 A | 4/2005 |
| KR | 10-2011-0058602 A | 6/2011 |
| KR | 10-2011-0095772 A | 8/2011 |
| KR | 10-2013-0013955 A | 2/2013 |
| KR | 10-2017-0020082 A | 2/2017 |
| KR | 10-2018-0000254 A | 1/2018 |
| KR | 10-2018-0061928 A | 6/2018 |

\* cited by examiner

LAMP EMPLOYING SEMICONDUCTOR LIGHT-EMITTING ELEMENT

CROSS REFERENCE TO RELATED APPLICATIONS

This application is the National Stage filing under 35 U.S.C. 371 of International Application No. PCT/KR2018/011357, filed on Sep. 27, 2018, which claims the benefit of earlier filing date and right of priority to Korean Application No. 10-2018-0078341, filed on Jul. 5, 2018, the entire contents of all these applications are all hereby incorporated by reference into the present application.

TECHNICAL FIELD

The present disclosure relates to a lamp employing semiconductor light-emitting elements or devices, and more particularly, a lamp having high uniformity of light.

BACKGROUND

Figure 1:
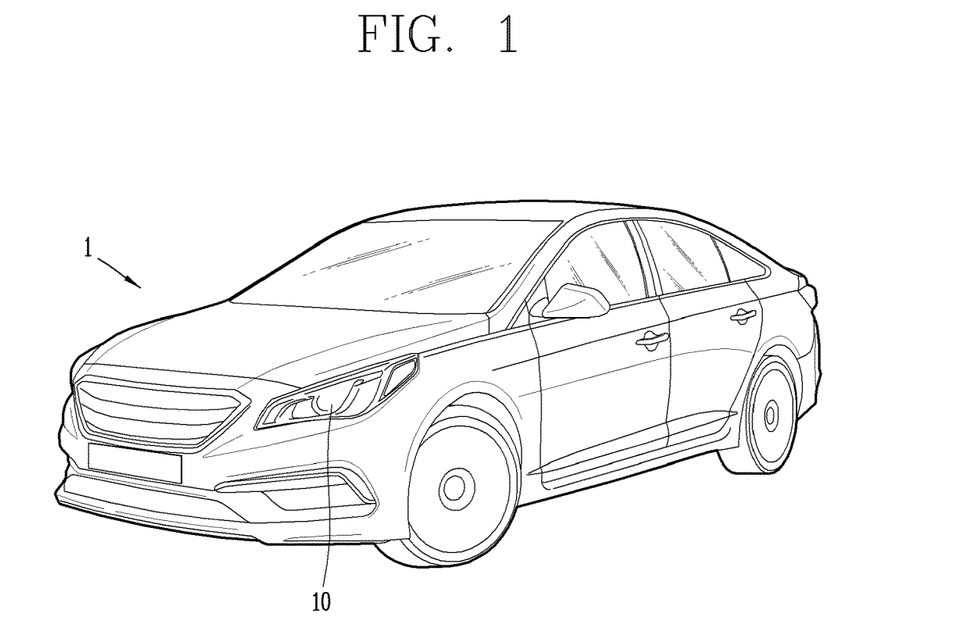
FIG. 1 is a conceptual view illustrating a vehicle.

Lamps that emit light are used in various fields. For example, a vehicle is equipped with various lamps each having a lighting function or a signaling function. Referring to FIG. 1, a lamp device 10 is provided in a vehicle 1 to increase illumination for improving visibility of the vehicle 1 and to indicate a driving state of the vehicle 1 to other vehicles.

A vehicle or automotive lamp device includes a headlamp installed at the front of a vehicle and a rear lamp installed at the rear thereof. The headlamp provides forward illumination during night driving. The rear lamp includes a stop (or brake) lamp turned on when the brake is pressed, and a turn signal lamp (or direction-indicator lamp) that indicates a proceeding direction of the vehicle.

Halogen lamps or gas discharge lamps have been usually used, but in recent years, light emitting diodes (LEDs) are in the spotlight as light sources for vehicle lamps.

The LEDs can enhance a degree of freedom for design of a lamp by minimizing a size thereof and exhibit economical efficiency by virtue of a semi-permanent lifespan, but most of the LEDs are currently produced in a form of a package. The LED itself other than the package is under development as a semiconductor light-emitting device of converting a current into light, namely, an image displaying light source equipped in an electronic device such as an information communication device.

However, lamps employing semiconductor light-emitting devices developed to date use LEDs in the package form, and thereby to have disadvantages, such as a low mass production yield rate, high fabrication costs, and low flexibility.

Meanwhile, a lamp using semiconductor light-emitting devices may have various areas. When the lamp has a large area, a voltage is not evenly or uniformly applied to individual devices, leading to a decrease in light uniformity of the lamp.

DISCLOSURE

Technical Problem

The present disclosure describes a lamp having a structure capable of applying a uniform current to semiconductor light-emitting devices disposed in the lamp.

Technical Solution

According to one aspect of the subject matter described in this application, a lamp includes a wiring substrate, a bus electrode formed on the wiring substrate along one direction, a plurality of electrode lines each formed on the wiring substrate, extending from the bus electrode, and having one end, a plurality of semiconductor light-emitting devices disposed to be parallel to one another along a direction in which the electrode lines are formed and spaced apart from adjacent electrode lines by a predetermined distance, a plurality of transparent electrodes electrically connecting the electrode lines and the semiconductor light-emitting devices, a current injection part formed along the one direction to be disposed parallel to the bus electrode, and a plurality of connection electrodes disposed between the bus electrode and the current injection part to be spaced apart along the one direction and electrically connecting the bus electrode and the current injection part. A part of the connection electrode may have a different resistance value.

Implementations according to this aspect may include one or more of the following features. For example, a power supply unit that is connected to one end of the current injection part and applies a current to the current injection part may be further provided, and resistance values of the connection electrodes may decrease as a distance from the power supply unit increases.

In some implementations, each of the connection electrodes may include a first connection portion connected to the current injection part, a resistance portion extending from one end of the first connection portion along the one direction, and a second connection portion extending from one end of the resistance portion and connected to the bus electrode.

In some implementations, lengths of the resistance portions of the connection electrodes may be different.

In some implementations, the lengths of the resistance portions of the connection electrodes may decrease as the distance from the power supply unit increases.

In some implementations, widths of the resistance portions of the connection electrodes may decrease as the distance from the power supply unit increases.

In some implementations, the bus electrode may include a first bus electrode disposed parallel to the current injection part, and a second bus electrode disposed to be spaced apart from the first bus electrode by a predetermined distance. Each of the semiconductor light-emitting devices may be disposed between an electrode line extending from the first bus electrode and an electrode line extending from the second bus electrode.

In some implementations, each of the semiconductor light-emitting devices may include a p-type electrode and an n-type electrode, one of the p-type electrode and the n-type electrode may be connected to the electrode line extending from the first bus electrode, and another one of the p-type electrode and the n-type electrode may be connected to the electrode line extending from the second bus electrode.

In some implementations, the electrode line extending from the second bus electrode may include a first electrode line extending in a first direction, and a second electrode line extending in a second direction opposite to the first direction from the same point where the first electrode line extends.

In some implementations, one of the p-type electrode and the n-type electrode may be connected to the first electrode line, and another one of the p-type electrode and the n-type electrode may be connected to the second electrode line.

Advantageous Effects

According to embodiments of the present disclosure, as a uniform voltage is applied to semiconductor light-emitting devices provided in a lamp, the semiconductor light-emitting devices provided in the lamp may emit light with the same brightness.

DETAILED DESCRIPTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A lamp disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it will be readily apparent to those skilled in the art that the configuration according to the embodiments described herein may also be applied to new product types of lamp.

Meanwhile, the lamp described herein may be used in a vehicle. A vehicle lamp may include a head lamp, a tail lamp, a position lamp, a fog lamp, a turn signal lamp, a brake lamp, an emergency lamp, a backup lamp, and the like.

Figure 2:
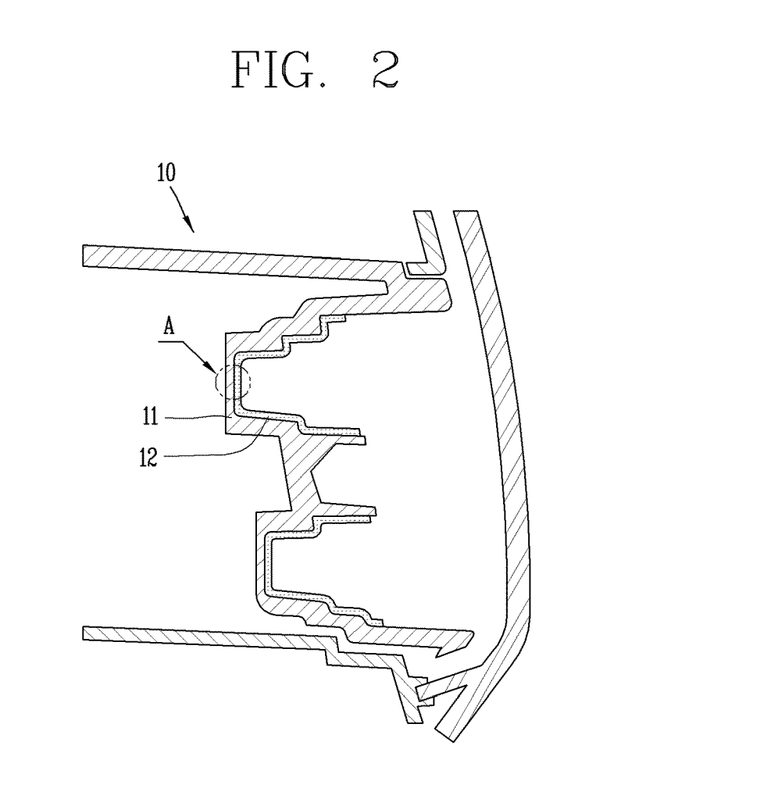
FIG. 2 is a cross-sectional view of a lamp device included in a vehicle.

FIG. 2 is a cross-sectional view of a lamp included in a vehicle.

A vehicle lamp 10 according to an embodiment of the present disclosure includes a frame 11 fixed to a vehicle body, and a light source unit 12 installed on the frame 11.

A wiring line for supplying power to the light source unit 12 may be connected to the frame 11, and the frame 11 may be fixed to the vehicle body directly or by using a bracket. According to the present disclosure, the vehicle lamp 10 may be provided with a lens unit to more diffuse and sharpen light emitted from the light source unit 12.

The light source unit 12 may be a flexible light source unit that can be curved, bent, twisted, folded, or rolled by an external force.

In a non-curved state of the light source unit 12 (e.g., a state having an infinite radius of curvature, hereinafter, referred to as a "first state"), the light source unit 12 is flat. When the first state is switched to a state that the light source unit 12 is bent by an external force (e.g., a state having a finite radius of curvature, hereinafter, referred to as a "second state"), the flexible light source unit may have a curved surface with at least part curved or bent.

A pixel of the light source unit 12 may be implemented by a semiconductor light-emitting device. The present disclosure exemplarily illustrates a light-emitting diode (LED) as a type of semiconductor light-emitting device for converting a current into light. The LED may be a light-emitting device having a small size, and thereby to serve as a pixel even in the second state.

Meanwhile, the light source unit 12 according to the present disclosure includes a unit light source, a base substrate, and a connection electrode. Hereinafter, the above-mentioned constituent elements (components) will be described in detail.

The light source unit 12 may be provided with only the unit light source. Hereinafter, the unit light source will be described in detail based on the light source unit 12 provided with only the unit light source.

Figure 3:
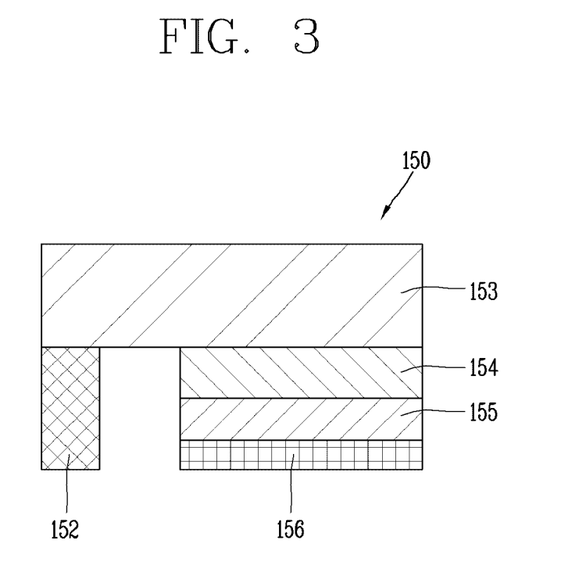
FIG. 3 is a conceptual view illustrating a flip chip semiconductor light-emitting device.
Figure 4:
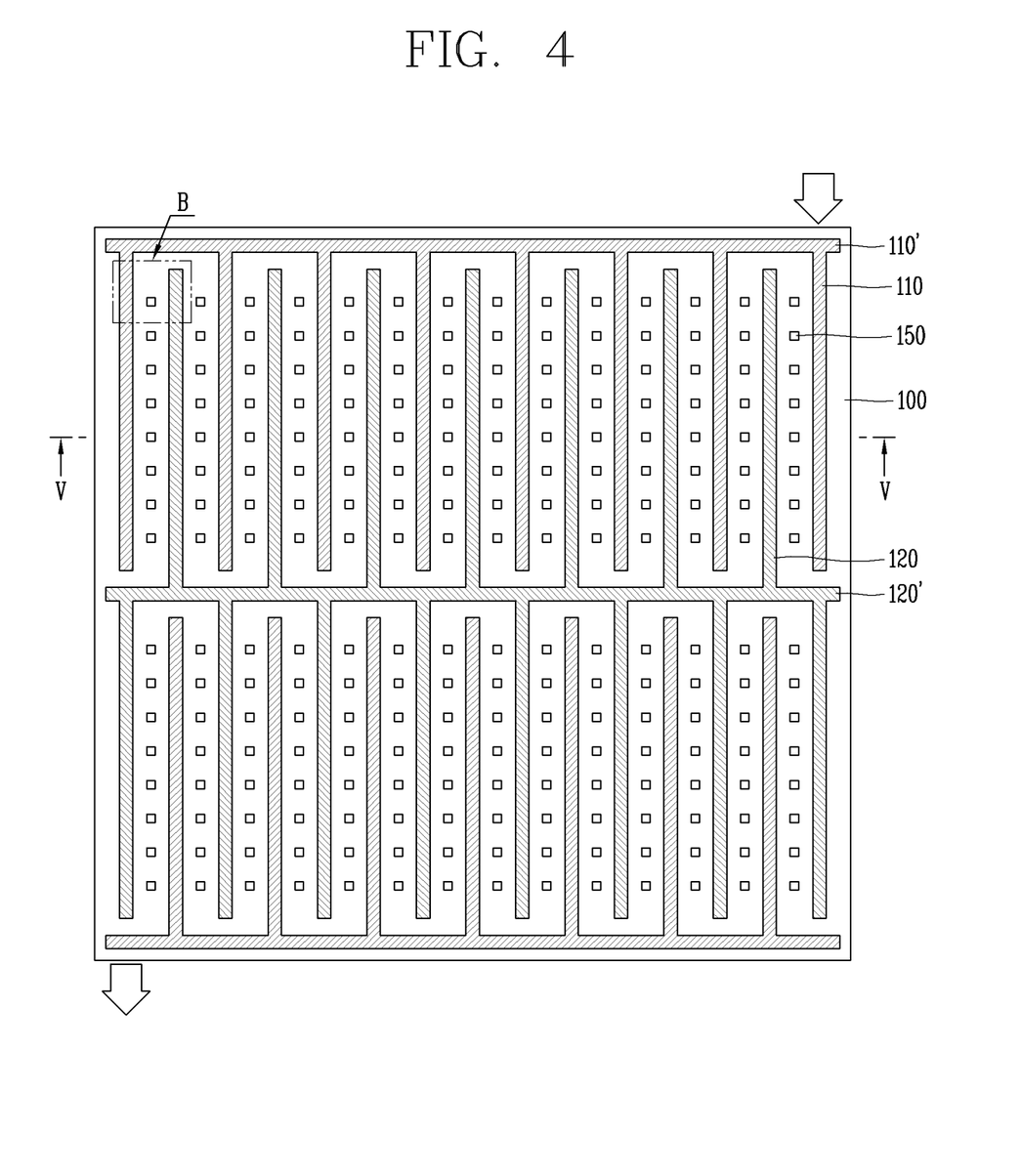
FIG. 4 is a planer view of an area A of FIG. 2.
Figure 5:
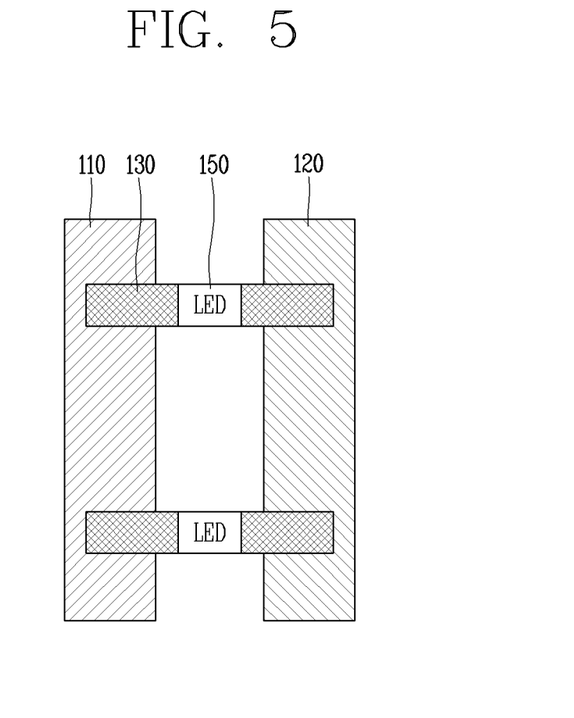
FIG. 5 is an enlarged view of an area B of FIG. 4.
Figure 6:
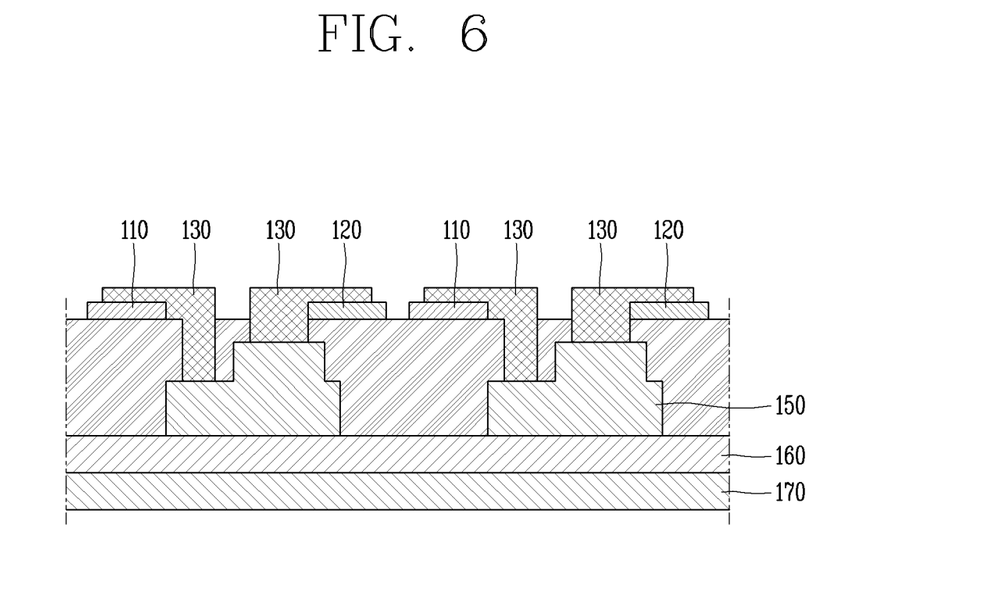
FIG. 6 is a cross-sectional view taken along the line "V-V" of FIG. 4.

FIG. 3 is a planar view of an area A of FIG. 2, FIG. 4 is a conceptual view of a flip chip semiconductor light-emitting device, FIG. 5 is an enlarged view of an area B of FIG. 3, and FIG. 6 is a cross-sectional view taken along the line "V-V" of FIG. 3.

As illustrated, the light source unit 12 includes a wiring substrate (or circuit board) 100, a plurality of electrode lines 110 and 120, a transparent electrode 130, and a semiconductor light-emitting device (or light-emitting device) 150. Hereinafter, the aforementioned components will be described in detail.

Referring to FIG. 3, a plurality of electrode lines may be disposed on the wiring substrate. The electrode lines 110 and 120 may protrude from a bus electrode 110' and a bus electrode 120', respectively, and extend in one direction to have a bar shape. Meanwhile, each of the electrode lines 110 and 120 has an end located opposite to a bus electrode.

When the electrode lines 110 and 120 are described as a bar each having two ends, one end is connected to one bus electrode, and another end is located opposite to another bus electrode. In this specification, an intermediate point between the two ends of the electrode line is referred to as a 'central portion' of the electrode line.

Meanwhile, two types of bus electrodes 110' and 120' may be disposed on the wiring substrate 100. In detail, a voltage applied between the bus electrode 110' and the bus electrode 120' is applied to each of the semiconductor light-emitting devices 150. This allows each of the semiconductor light-emitting devices 150 to emit light. The electrode lines 110 and 120 that extend from the bus electrodes 110' and 120', respectively, are electrically connected to the semiconductor light-emitting devices 150, so as to allow the voltage applied between the two bus electrodes 110' and 120' to be applied to each of the semiconductor light-emitting devices 150.

Here, individual semiconductor light-emitting devices 150 should be electrically connected to both the electrode line 110' and the electrode line 120'. Before discussing a structure in which the semiconductor light-emitting devices 150 are electrically connected to the electrode lines, a structure of the semiconductor light-emitting devices 150 will be described.

Referring to FIG. 4, the semiconductor light-emitting device 150 may be a flip chip type light-emitting device.

For example, the semiconductor light-emitting device includes a p-type electrode 156, a p-type semiconductor layer 155 on which the p-type electrode 156 is formed, an active layer 154 formed on the p-type semiconductor layer 155, an n-type semiconductor layer 153 formed on the active layer 154, and an n-type electrode 152 formed on the n-type semiconductor layer 153 with being spaced apart from the p-type electrode 156 in a horizontal direction. Here, the p-type electrode 156 may be electrically connected to the electrode line 110 that extends from one of the two bus electrodes, and the n-type electrode 152 may be electrically connected to the electrode line 120 that extends from the other one.

Referring to FIG. 6, in the lamp according to the present disclosure, the p-type electrode and the n-type electrode are disposed in a direction of a light emitting surface. That is, light emitted from the lamp according to the present disclosure is discharged to the outside by passing through the p-type electrode and the n-type electrode. Due to this structural feature, in order to increase an amount (or quantity) of light of the lamp, structures overlapping the semiconductor light-emitting devices should be minimized to increase the amount of light of the lamp.

Meanwhile, in order to maximize the amount of light of the lamp, a reflective layer (or reflector) 160 may be disposed at an opposite side of the light emitting surface of the semiconductor light-emitting device. The reflective layer 160 reflects light emitted from the semiconductor light-emitting devices 150 and directed downward of the lamp, so as to increase the amount of light of the lamp. The reflective layer 160 may be disposed on a base substate 170.

When an electrode line made of a metal or alloy is electrically connected to the semiconductor light-emitting device in a direct manner, the amount of light of the lamp may be reduced since the electrode line covers or blocks a light emitting surface of the semiconductor light-emitting device. To prevent this, referring to FIGS. 5 and 6, each of the electrode lines 110 and 120 is electrically connected to the semiconductor light-emitting device 150 through the transparent electrode 130.

The transparent electrode 130 may be made of a material having high light transmittance and conductivity. For example, the transparent electrode 130 may be Indium Tin Oxide (ITO). The transparent electrode 130 has much higher light transmittance than the electrode lines, but has lower electrical conductivity. As illustrated in FIG. 6, when the semiconductor light-emitting device 150 is disposed to overlap the transparent electrode 130, a decrease in the amount of light of the lamp may be minimized.

The lamp according to the present disclosure may include a power supply unit that applies a current to the semiconductor light-emitting devices 150. When the power supply unit applies a current to a bus electrode, the applied current flows to semiconductor light-emitting devices along a plurality of electrode lines. However, when the power supply unit applies a current to one end of the bus electrode, an amount of current flowing to the electrode lines arranged in a row varies from one to another. This is due to a voltage drop occurring at each of the electrode lines. This may result in non-uniformity of voltage distribution as illustrated in FIG. 7.

Figure 7:
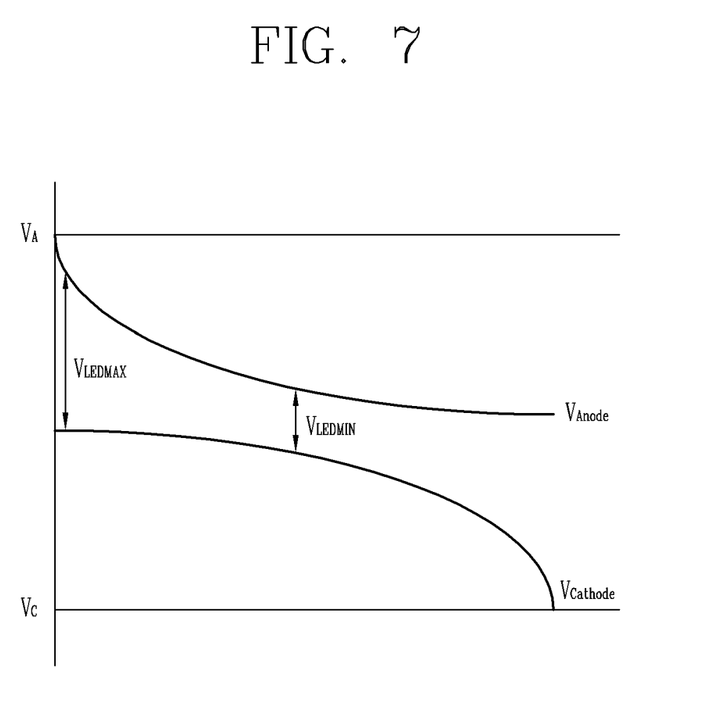
FIG. 7 is a graph showing a magnitude of voltage applied to semiconductor light-emitting devices according to a distance between bus electrodes and the semiconductor light-emitting devices in a lamp described in FIG. 3.

FIG. 7 is a graph showing a magnitude of voltage applied to semiconductor light-emitting devices according to a distance between bus electrodes and the semiconductor light-emitting devices in the lamp described in FIG. 3.

As illustrated, a voltage is gradually decreased as a distance between the semiconductor light-emitting device and the bus electrode increases, and is then increased again. That is, a voltage applied to semiconductor light-emitting devices located adjacent to the central portion of the electrode line is less (or lower) than a voltage applied to semiconductor light-emitting devices located close to the two ends of the electrode line. Accordingly, an amount of light emitted from the semiconductor light-emitting devices varies depending on their positions. As the area of the lamp increases, the difference in the amount of light becomes more apparent.

In order to solve this problem, which is due to a voltage drop, the present disclosure provides a structure that has uniform voltage distribution regardless of the positions of the semiconductor light-emitting devices. The lamp according to the present disclosure may include all of the components described in FIGS. 3 to 6.

Figure 8:
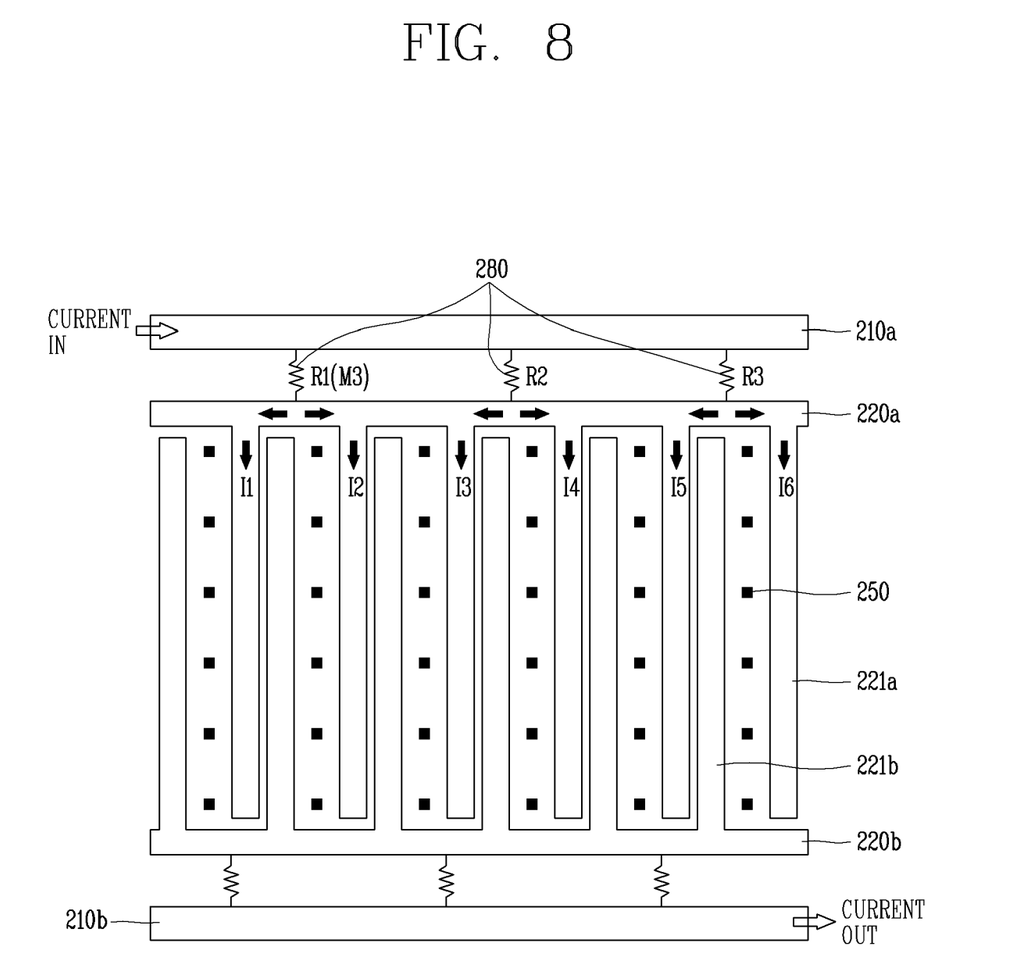
FIG. 8 is a conceptual view of a lamp according to one embodiment of the present disclosure.
Figure 9:
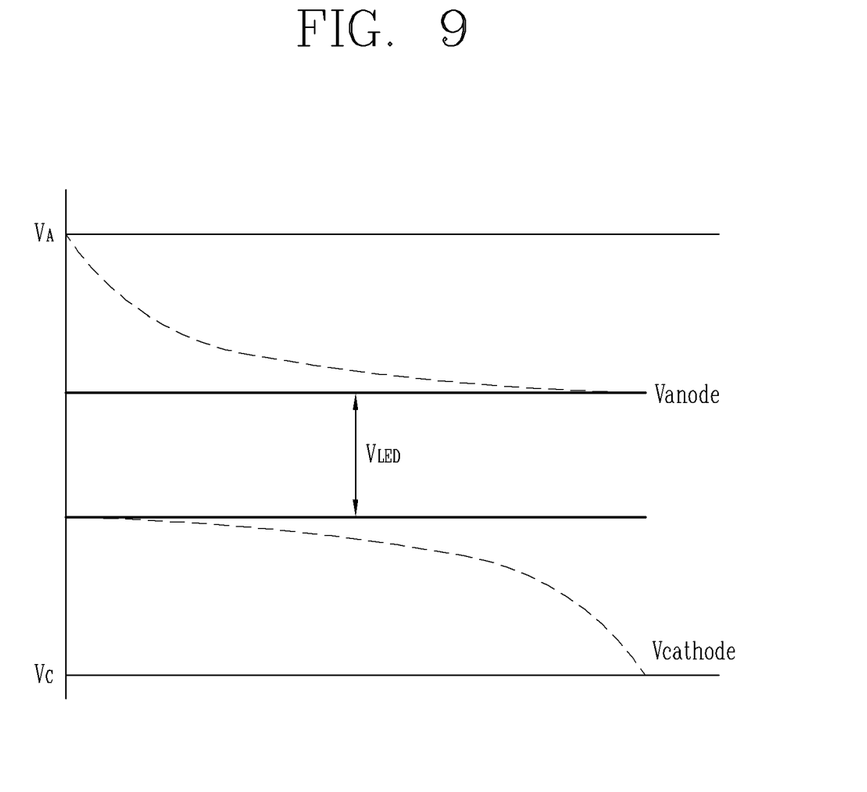
FIG. 9 is a graph showing effects of preventing a voltage drop in the lamp according to the present disclosure.

FIG. 8 is a conceptual view of a lamp according to one embodiment of the present disclosure, and FIG. 9 is a graph showing effects of preventing a voltage drop in the lamp according to the present disclosure.

Although the above-described transparent electrode is not illustrated in FIG. 8, the electrode line is electrically connected to the semiconductor light-emitting device through the transparent electrode as described in FIG. 5. In all of drawings to be described hereinafter, the transparent electrode is omitted, however, all electrode lines are electrically connected to the semiconductor light-emitting devices through the respective transparent electrodes.

The lamp according to the present disclosure includes a wiring substrate, a bus electrode, a plurality of electrode lines, a plurality of semiconductor light-emitting devices, a plurality of transparent electrodes, and a current injection part (or current input unit). Descriptions of the wiring substrate, the plurality of light-emitting devices, and the plurality of transparent electrodes are replaced with the descriptions of FIGS. 1 to 7.

In the present disclosure, a current injection part 210a is used instead of directly applying a current from a power supply unit to a bus electrode 220a. Referring to FIG. 8, the current injection part 210a extends along one direction in which the bus electrode 220a extends, so as to be disposed in parallel with the bus electrode 220a.

The current injection part 210a is electrically connected to the bus electrode 220a. To this end, the present disclosure includes a plurality of connection electrodes 280. The connection electrodes 280 are disposed between the bus electrode 220a and the current injection part 210a. The plurality of connection electrodes 280 is disposed to be spaced apart in the one direction in which the bus electrode 220a extends by a predetermined distance. A current applied from the power supply unit is applied to the bus electrode 220a along the plurality of connection electrodes 280.

Meanwhile, the connection electrodes 280 may have different resistance values. More specifically, resistance values of the connection electrodes 280 may decrease as a distance from the power supply unit 237 increases. This is to compensate for a decrease in voltage, which is caused by an increasing distance from the power supply unit 237. Accordingly, in the present disclosure, the same current may be applied to all of electrode lines 221a extending from the bus electrode 220a. Meanwhile, a current withdrawing part 210b, a bus electrode 221b, and electrode lines 221b are provided at a current out part at the other end of a current in part. Current injection part 210 and current withdrawal part 210b can be electrodes that carry current.

When the same current is applied to each electrode line 221a, a voltage applied to each of the semiconductor light-emitting devices 250 becomes the same as illustrated in FIG. 9. Thus, in the present disclosure, the same amount of light may be emitted regardless of positions of the semiconductor light-emitting devices 250.

Meanwhile, the present disclosure provides various modified embodiments for sequentially changing resistance values of the connection electrodes.

Figure 10:
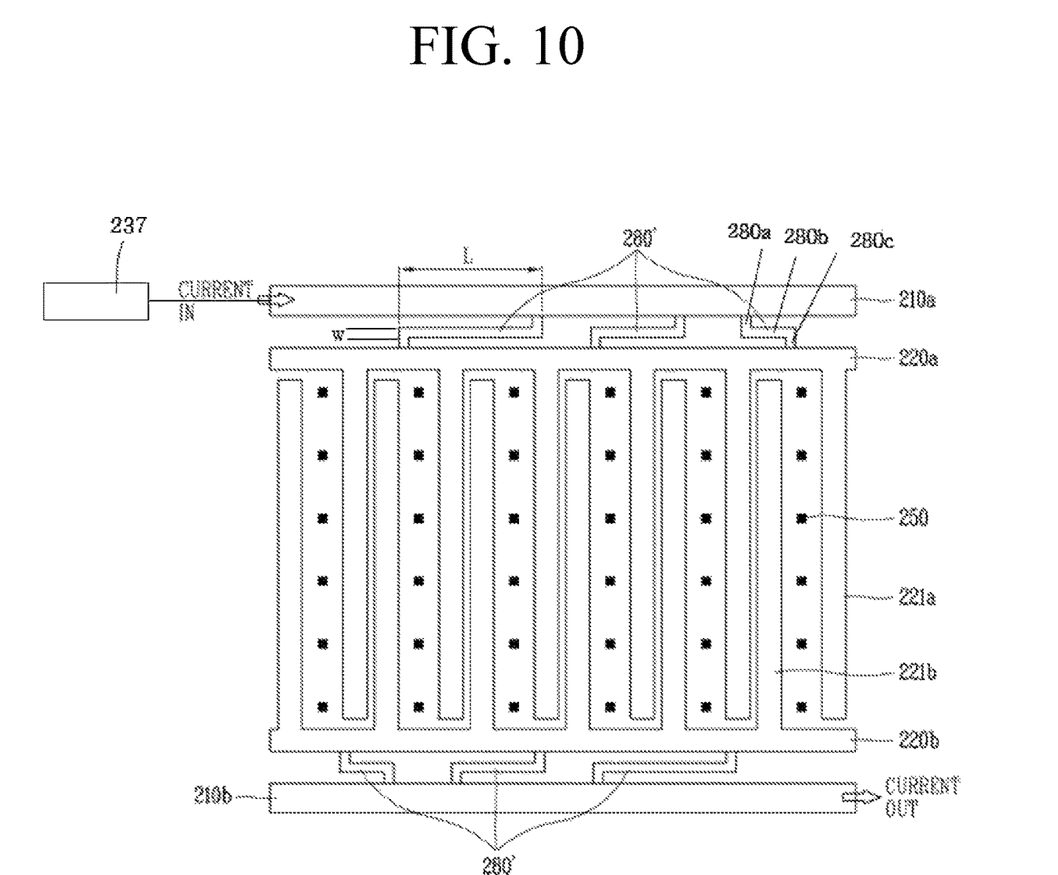
FIG. 10 is a conceptual view illustrating a modified example of a connection electrode provided in the lamp according to the present disclosure.

FIG. 10 is a conceptual view illustrating a modified example of the connection electrode provided in the lamp according to the present disclosure.

Referring to FIG. 10, a connection electrode 280' according to the present disclosure includes a first connection portion connected to the current injection part 210a, a resistance portion extending from one end of the first connection portion 280a along the one direction, and a second connection portion 280c extending from one end of the resistance portion 280b and connected to the bus electrode 220a. Meanwhile, a current withdrawing part 210b, a bus electrode 221b, and electrode lines 221b are provided at a current out part at the other end of a current in part. Current injection part 210 and current withdrawal part 210b can be electrodes that carry current.

In the present disclosure, shapes of the resistance portions vary, and thereby to change resistance values of the connection electrodes 280'. In one implementation, lengths L of the resistance portions of the connection electrodes 280' may vary from one to another. In detail, the lengths of the resistance portions of the connection electrodes 280' may decrease with an increase in distance from the power supply unit. The shorter the length of the resistance portion, the lower the resistance value of the connection electrode 280'. In this structure, a resistance value of the connection electrodes 280 decreases as the distance from the power supply unit increases.

In another implementation, widths (W) of the resistance portions may decrease with an increase in distance from the power supply unit. The lower (thinner) the width (W) of the resistance portion, the lower the resistance value of the connection electrode 280'. In this structure, a resistance value of the connection electrodes 280 decreases as the distance from the power supply unit increases.

As such, in the present disclosure, resistance values of the connection electrodes are variously adjusted by utilizing a space between the bus electrode and the current injection part. Accordingly, the area of non-light emitting region (or surface) of the lamp may be minimized while increasing light uniformity of the lamp.

Meanwhile, in the present disclosure, light uniformity of the lamp is increased by crossing wirings connected to the semiconductor light-emitting devices.

Figure 11:
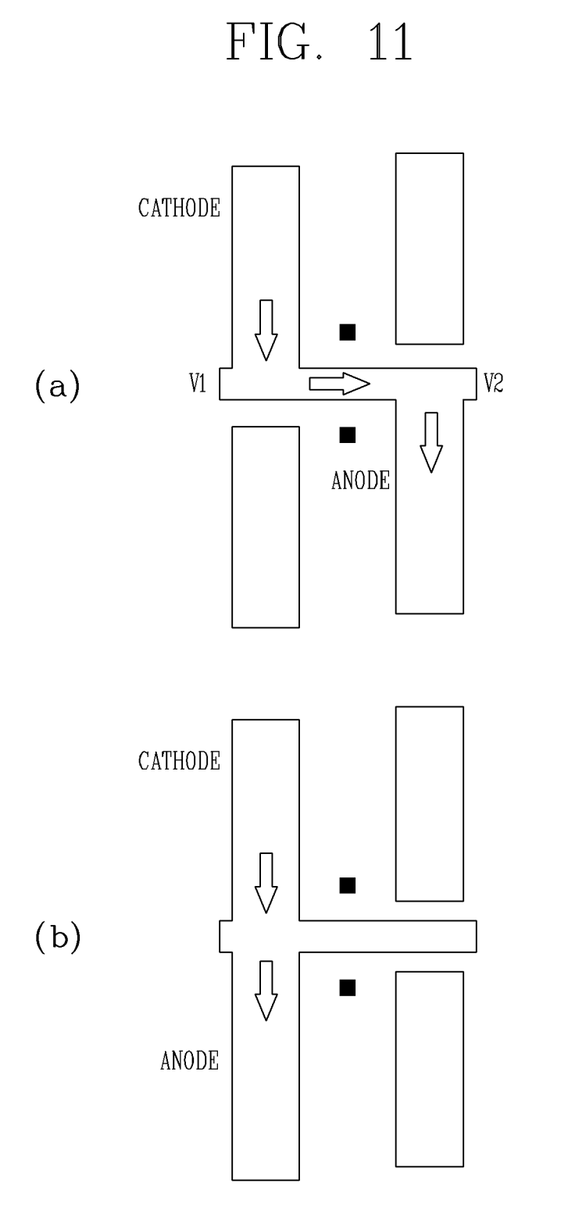
FIG. 11 is a conceptual view illustrating a voltage drop depending on a bus electrode structure.
Figure 12:
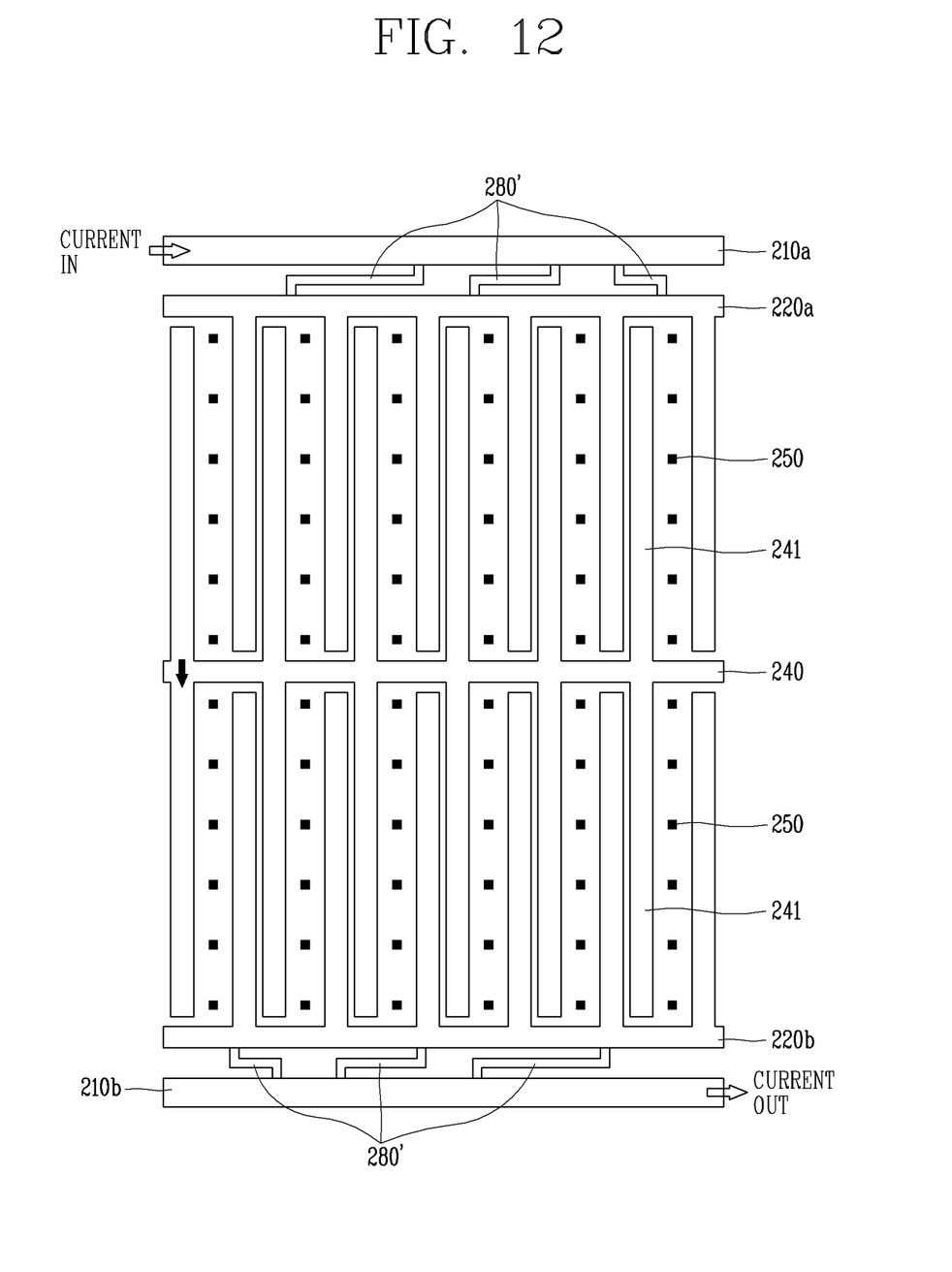
FIG. 12 is a conceptual view illustrating a modified embodiment of the lamp according to the present disclosure.

FIG. 11 is a conceptual view illustrating a voltage drop depending on a bus electrode structure, and FIG. 12 is a conceptual view illustrating a modified embodiment of the lamp according to the present disclosure.

A bus electrode provided in the lamp according to the present disclosure includes a first bus electrode disposed to be parallel to the current injection part 210a and a second bus electrode disposed to be spaced apart from the first bus electrode by a predetermined distance.

Here, the first bus electrode corresponds to the bus electrode 110' illustrated in an upper part or side of FIG. 3, and the second bus electrode corresponds to the bus electrode 120' illustrated in a central part of FIG. 3. In the second bus electrode, all regions should be formed as an equipotential surface, however, referring to (a) of FIG. 11, a voltage drop occurs between V1 and V2. This adversely affects light uniformity of the lamp.

In order to prevent this, in the present disclosure, electrode lines extend in opposite directions at the same point of a bus electrode as illustrated in (b) of FIG. 11. Here, an electrode extending in a first direction is used as a cathode, and an electrode extending in a second direction opposite to the first direction is used as an anode. To this end, a semiconductor light-emitting device located above the bus electrode and a semiconductor light-emitting device located below the bus electrode are 180 degrees opposite (or inverted) from each other.

More specifically, a p-type electrode of the semiconductor light-emitting device located above the bus electrode of (b) of FIG. 11 is electrically connected to an electrode line located at a left side of the semiconductor light-emitting device. In contrast, a p-type electrode of the semiconductor light-emitting device located below the bus electrode of (b) of FIG. 11 is electrically connected to an electrode line located at a right side of the semiconductor light-emitting device.

When the structure of (b) of FIG. 11 is entirely applied to a lamp, the lamp will have a structure as illustrated in FIG. 12. As illustrated, a first bus electrode 220a is electrically connected to a current injection part 210a, and two types of electrode lines 241 are formed on a second bus electrode 240. In detail, a first electrode line (upper lines of 241) that extends in a first direction and a second electrode line (lower lines of 241) that extends in a second direction opposite to the first direction are formed on the second bus electrode 240. Here, the second electrode line extends from the same point where the first electrode line extends.

The first and second electrode lines extend in opposite directions from one point of the second bus electrode 240. A p-type electrode of the semiconductor light-emitting devices is connected to one of the first electrode line and the second electrode line, and an n-type electrode thereof is connected to the other one. This may result in preventing voltage variations in the second bus electrode 240.

As described above, according to the present disclosure, as a uniform voltage is applied to the semiconductor light-emitting devices provided in the lamp, the semiconductor light-emitting devices provided in the lamp may emit light with the same brightness.

The aforementioned lamp employing the semiconductor light-emitting devices is not limited to the configuration and the method of the embodiments described above, but the embodiments may be configured such that all or some of the embodiments are selectively combined so that various modifications can be made.

The invention claimed is:

1. A lamp, comprising:
a wiring substrate;
a bus electrode formed on the wiring substrate along one direction;
a plurality of electrode lines each formed on the wiring substrate, extending from the bus electrode, and having one end;
a plurality of semiconductor light-emitting devices disposed to be parallel to one another along a direction in which at least two electrode lines of the plurality of electrode lines are spaced apart from each other by a predetermined distance;
a plurality of transparent electrodes electrically connecting each of the plurality of electrode lines and one of the plurality of semiconductor light-emitting devices, respectively;
a current injection part formed along the one direction to be disposed parallel to the bus electrode; and
a plurality of connection electrodes disposed between the bus electrode and the current injection part to be spaced apart along the one direction and electrically connecting the bus electrode and the current injection part,
wherein the plurality of connection electrodes have different resistance values.

2. The lamp of claim 1, further comprising a power supply unit connected to one end of the current injection part so as to apply a current to the current injection part,
wherein the different resistance values of the plurality of connection electrodes decrease as a distance from the power supply unit increases.

3. The lamp of claim 2, wherein each of the plurality of connection electrodes comprises:
a first connection portion connected to the current injection part;
a resistance portion extending from one end of the first connection portion along the one direction; and
a second connection portion extending from one end of the resistance portion and connected to the bus electrode.

4. The lamp of claim 3, wherein each length of the resistance portions of the plurality of connection electrodes is different.

5. The lamp of claim 4, wherein each length of the resistance portions of the plurality of connection electrodes decreases as the distance from the power supply unit increases.

6. The lamp of claim 4, wherein each width of the resistance portions of the plurality of connection electrodes decreases as the distance from the power supply unit increases.

7. The lamp of claim 1, wherein the bus electrode comprises:
a first bus electrode disposed parallel to the current injection part; and
a second bus electrode disposed to be spaced apart from the first bus electrode by a predetermined distance,
wherein each of the plurality of semiconductor light-emitting devices is disposed between an electrode line extending from the first bus electrode and an electrode line extending from the second bus electrode.

8. The lamp of claim 7, wherein each of the plurality of semiconductor light-emitting devices includes a p-type electrode and an n-type electrode,
wherein one of the p-type electrode and the n-type electrode is connected to the electrode line extending from the first bus electrode, and
wherein another one of the p-type electrode and the n-type electrode is connected to the electrode line extending from the second bus electrode.

9. The lamp of claim 8, wherein the electrode line extending from the second bus electrode comprises:
a first electrode line extending in a first direction; and
a second electrode line extending in a second direction opposite to the first direction from the same point where the first electrode line extends.

10. The lamp of claim 9, wherein one of the p-type electrode and the n-type electrode is connected to the first electrode line, and
wherein another one of the p-type electrode and the n-type electrode is connected to the second electrode line.

11. A lamp device, comprising:
a wiring substrate;
a first bus electrode formed on the wiring substrate along one direction;
a plurality of first electrode lines each formed on the wiring substrate, and extending from the first bus electrode;
a plurality of semiconductor light-emitting devices disposed to be parallel to one another along a direction in which the plurality of first electrode lines are formed and spaced apart from the plurality of first electrode lines by a predetermined distance;
a current injection part formed along the one direction to be disposed parallel to the first bus electrode; and
a plurality of first connection electrodes disposed between the first bus electrode and the current injection part to be spaced apart along the one direction and electrically connecting the first bus electrode and the current injection part,
wherein each length of the plurality of first connection electrodes is different.

12. The lamp device of claim 11, wherein the plurality of first connection electrodes have different resistance values.

13. The lamp device of claim 11, further comprising:
a second bus electrode formed on the wiring substrate along the one direction;
a plurality of second electrode lines each formed on the wiring substrate, and extending from the second bus electrode;
a current withdrawing part formed along the one direction disposed parallel to the second bus electrode; and
a plurality of second connection electrodes disposed between the second bus electrode and the current withdrawing part to be spaced apart along the one direction and electrically connecting the second bus electrode and the current withdrawing part.

14. The lamp device of claim 13, wherein each length of the plurality of second connection electrodes is different.

15. The lamp device of claim 14, wherein the plurality of second connection electrodes have different resistance values.

16. The lamp device of claim 11, further comprising a plurality of transparent electrodes electrically connecting adjacent first and second electrode lines and the plurality of semiconductor light-emitting devices.

17. The lamp device of claim 11, further comprising a power supply unit connected to one end of the current injection part,
    wherein the different lengths of the plurality of first connection electrodes decrease as a distance from the power supply unit increases.

18. The lamp device of claim 17, wherein each of the plurality of first connection electrodes comprises:
    a first connection portion connected to the current injection part;
    a resistance portion extending from one end of the first connection portion along the one direction; and
    a second connection portion extending from one end of the resistance portion and connected to the first bus electrode.

19. The lamp device of claim 18, wherein each width of the resistance portions of the plurality of first connection electrodes decreases as the distance from the power supply unit increases.

20. The lamp device of claim 13, further comprising a third bus electrode formed on the wiring substrate along the one direction; and
    a plurality of third electrode lines each formed on the wiring substrate, and extending from the third bus electrode,
    wherein the plurality of semiconductor light-emitting devices are disposed between adjacent first and third electrode lines, and between adjacent second and third electrode lines.

\* \* \* \* \*